United States Patent [19]
Yokoyama

[11] Patent Number: 5,039,730
[45] Date of Patent: Aug. 13, 1991

[54] FIBER REINFORCED HEAT-RESISTANT POLYOLEFIN COMPOSITIONS

[75] Inventor: Akira Yokoyama, Hiroshima, Japan

[73] Assignee: Mitsui Petrochemical Industries, Ltd., Tokyo, Japan

[21] Appl. No.: 269,746

[22] Filed: Oct. 27, 1988

[30] Foreign Application Priority Data

Mar. 3, 1987 [JP] Japan ................... 62-46662

[51] Int. Cl.$^5$ .................... C08L 51/06; C08L 7/14
[52] U.S. Cl. .................... 524/504; 524/494
[58] Field of Search .................... 524/504

[56] References Cited

U.S. PATENT DOCUMENTS 4,501,827 2/1985 Nagano .................. 524/504
4,748,169 5/1988 Izutsu .................. 524/504

FOREIGN PATENT DOCUMENTS

EP-A-
0158989 10/1985 European Pat. Off. .
59-207921 11/1984 Japan .

OTHER PUBLICATIONS

WPIL, File Supplier, AN=85-009427, Derwent Publications Ltd., London, GB.

Primary Examiner—Paul R. Michl
Assistant Examiner—Peter Szekely
Attorney, Agent, or Firm—Nixon & Vanderhye

[57] ABSTRACT

In accordance with the present invention, there are provided fiber reinforced heat-resistant polyolefin compositions comprising 5-85% by weight of polyphenylene sulfide (A), 15-95% by weight of modified polyolefin (B) having a melting point of above 200° C., which has been graft-modified, either partly or wholly, with 0.01-10% by weight of unsaturated carboxylic acid or its derivative, 10-60 parts by weight, based on 100 parts by weight of (A)+(B), of reinforcing fiber (C) and, if necessary, 5-30 parts by weight, based on 100 parts by weight of (A)+(B), of oxazoline-modified polystyrene (D). The compositions thus provided are excellent in heat resistance, water resistance, moisture resistance and solderability, and that excellent in mechanical strength.

2 Claims, No Drawings

FIBER REINFORCED HEAT-RESISTANT POLYOLEFIN COMPOSITIONS

FIELD OF THE INVENTION

The invention relates to fiber reinforced polyolefin compositions. More particularly, the invention relates to fiber reinforced polyolefin compositions which are excellent in mechanical strength such as heat resistance, tensile strength and the like and also in soldering heat resistance, said compositions containing modified polyolefins which have been modified by grafting thereon unsaturated carboxylic acids or derivatives thereof, and polyphenylene sulfides and, if necessary, oxazoline-modified polystyrenes.

BACKGROUND OF THE INVENTION

It is known to improve mechanical properties such as tensile strength, bending strength, impact strength and the like and heat resistance of polyolefins by incorporating thereinto reinforcing materials such as glass fiber and the like. However, such mechanical properties and heat resistance of polyolefins are not sufficiently improved by merely incorporating thereinto glass fiber because there is attained no bonding power therebetween, and hence it is not possible to obtain such effect of improvement as may be obtained in the case where glass fiber is incorporated into unsaturated polyesters having in the molecule polar groups, or into epoxy resins.

On one hand, there are proposed various processes for improving bonding power between polyolefins and glass fiber. For instance, Japanese Patent Publn. No. 41096/1974 discloses a process in which maleic acid or maleic anhydride, polyolefin and glass fiber subjected to surface treatment with aminosilane type compounds are allowed to undergo reaction at a temperature higher than a melting point of the polyolefin in the presence of organic peroxides. Further, Japanese Patent Publn. No. 31895/1977 discloses compositions comprising polyolefins, modified polyolefins having aromatic carboxylic acid anhydride units and glass fiber subjected to surface treatment with aminosilane type compounds. Still further, Japanese Patent Publn. No. 10265/1976 discloses a process for preparing compositions comprising modified polyolefins obtained by melt kneading in an atmosphere of nitrogen polyolefins and maleic anhydride in the presence and glass type reinforcing materials, or compositions comprising above-mentioned components and unmodified polyolefins. The processes and compositions as proposed above have their respective effects in their own ways.

Recently, however, there is a strong and growing demand for so-called engineering plastics, i.e. heat-resistant thermoplastic resins which are more excellent in heat resistance, and that in mechanical strength, and hence it is not desired that a further improvement is made in the above-mentioned compositions which are all found to be still insufficient in heat resistance and mechanical strength. Japanese Patent Publn. No. 9943/1981 discloses, as one example of such improvement as desired above, polyolefin resin compositions comprising (A) polyolefin resins added with unsaturated carboxylic acid or polyolefin resins added with unsaturated carbolylic acid diluted with polyolefin resins, (B) nitrogen containing resins and (C) fillers, and it is alleged that by virtue of incorporating into polyolefin resin compositions of the nitrogen containing resins, the polyolefin resin compositions obtained thereby are found excellent in mechanical strength, heat resistance, coatability and the like. However, it has been found that even when ABS or nylon 6 concretely disclosed in the said publication is incorporated into polyolefin having a melting point of above 200° C., for example, poly-4-methyl-1-pentene, which is particularly excellent in heat resistance among other polyolefins, heat resistance of the resulting polyolefin resin composition is not improved at all, or rather, decreases when ABS or the like is incorporated thereinto.

Japanese patent L-O-P Publn. No. 53549/1985 filed by the present applicant discloses that compositions comprising poly-4-methyl-1-pentene, unsaturated carboxylic acid graft modified poly-4-methyl-1-pentene, nylon 66 and inorganic fiber are excellent in heat resistance and mechanical strength in comparison with fiber reinforced polyolefin resin compositions proposed prior to the filing date of said publication. On studying further the compositions disclosed in said publication, however, the present applicant has found that said compositions are relatively high in water absorption properties due to the presence of nylon 66, and there is a fear of decrease in mechanical strength of the resulting compositions by moisture absorption thereof.

The present invention is intended to solve such problems associated with the prior art as mentioned above, and an object of the invention is to provide fiber reinforced polyolefin compositions which are excellent in heat resistance as well as in water resistance, moisture resistance and solderability, and that excellent in mechanical strength.

SUMMARY OF THE INVENTION

The fiber reinforced polyolefin compositions of the present invention are classed under two types. That is, the present fiber reinforced polyolefin compositions of first type are characterized by comprising 5-85% by weight of polyphenylene sulfide (A), 15-95% by weight of modified polyolefin having a melting point of above 200° C. (B), which has been graft modified, either partly or wholly, with 0.01-10% by weight of unsaturated carboxylic acid or its derivative, and 10-60 parts by weight, based on 100 parts by weight of (A)+(B), of reinforcing fiber (C).

The present fiber reinforced polyolefin compositions of a second type are characterized by comprising 5-85% by weight of polyphenylene sulfide (A), 15-95% by weight of modified polyolefin having a melting point of above 200° C. (B), which has been graft modified, either partly or wholly, with 0.01-10% by weight of unsaturated carboxylic acid or its derivative, 10-60 parts by weight, based on 100 parts by weight of (A)+(B), of reinforcing fiber (C), and 5-30 parts by weight of oxazoline-modified polystyrene (D).

The fiber reinforced polyolefin compositions of the present invention contain such components as illustrated above, and are excellent. In heat resistance as well as in water resistance, moisture resistance and solderability, and that excellent in mechanical strength.

DETAILED DESCRIPTION OF THE INVENTION

The fiber reinforced polyolefin compositions of the present invention are illustrated below in more detail.

Polyphenylene Sulfide (A)

Polyphenylene sulfides (A) used in the present invention have as a main component a repeating unit represented by the structural formula

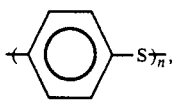

and may further contain other copolymerizable component units, for example,

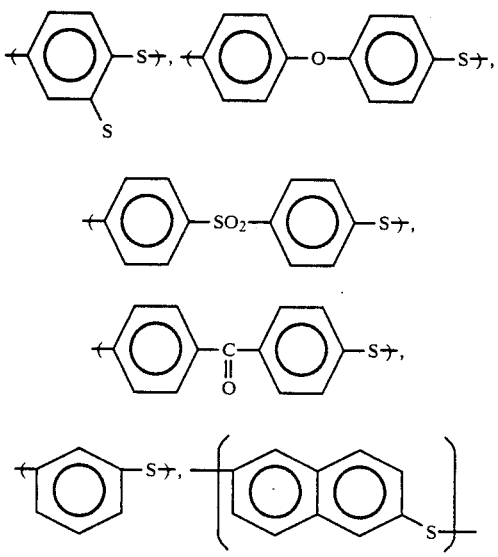

and the like.

These polyphenylene sulfides preferably have a melt viscosity of 50-50000 poises, particularly 100-5000 poises as measured at 300° C. for 200 sec$^{-1}$.

Modified Polyolefin (B)

The modified polyolefins (B) used in the present invention are polyolefins which have been raft modified, either partly or wholly, with 0.01-10% by weight, preferably 0.1-5% by weight of a graft monomer selected from among unsaturated carboxylic acids and derivatives thereof, and which are crystalline polymers usually having an intrinsic viscosity of 0.5-15 dl/g, preferably 0.6-10 dl/g and a melting point (ASTM D 3418) of above 200° C. If the graft amount of unsaturated carboxylic acid or derivative thereof is less than 0.01% by weight, the modified polyolefins (B) obtained are found poor in compatibility with the aforesaid polyphenylene sulfides (A) and hence the resulting compositions are liable to become poor in heat resistance. On the other hand, if the said draft amount exceeds 10% by weight, the resulting compositions are liable to become poor in water resistance.

The modified polyolefins (B) illustrated above must have the melting point of above 200° C., preferably above 230° C. If the modified polyolefin (B) used have the melting point of less than 200° C., heat resistance obtained is insufficient. Therefore, even when such modified polyolefin (B) having the melting point of less than 200° C. is used in combination with the polyphenylene sulfide and reinforcing fiber, the resulting composition is low in heat resistance, thus the use of such modified polyolefin (B) shows a tendency toward difficulty in obtaining a polyolefin compositions excellent in heat resistance. Furthermore, since the polyolefin composition must be heated at least to above the melting point when said composition is subjected to melt molding, the use of such modified polyolefin as having a melting point of less than 200° C. brings about deterioration or decomposition thereof at the time of the melt molding, showing a tendency toward difficulty in obtaining a molded article having excellent properties in all respect, such as heat resistance, water resistance, moisture resistance and mechanical strength. Accordingly, modified polyolefins used in the present invention are preferably those which have, if possible, a melting point substantially equal to that of polyphenylene sulfides used in combination therewith, and desirably the modified polyolefins have a melting point of above 200° C., preferably 230° C., as mentioned previously.

Polyolefins which are used as a base of such high melting modified polyolefins as mentioned above are obtained by homopolymerization or copolymerization of monomers having in the molecular chain relatively bulky side chains. Concretely, poly-4-methyl-1-pentene or poly-3-methyl-1-butene is used as a base of the modified polyolefins (B) as mentioned above.

Poly-4-methyl-1-pentene used as a base of such modified polyolefins as mentioned above is concretely a homopolymer of 4-methyl-1-pentene or a copolymer of 4-methyl-1-pentene and other α-olefin of 2 to 20 carbon atoms, for example, ethylene, propylene, 1-butene, 1-hexene, 1-octene, 1-decene, 1-tetradecene, 1-octadecene, etc. Usually, there are used polymers consisting essentially of at least 85 mol %, preferably at least 91 mol % of 4-methyl-1-pentene. Such poly-4-methyl-1-pentenes preferably have a melt flow rate (load: 5 kg, temperature: 260° C.) of 5-500 g/min, more preferably 25-150 g/min. If the poly-4-methyl-1-pentene used has a melt flow rate of less than 5 g/min, the modified polyolefin containing the same becomes excessively high in melt viscosity, showing a strong tendency to become poor in moldability and, on the other hand, if said melt flow rate exceeds 500 g/min, the modified polyolefin becomes excessively low in melt viscosity, showing a strong tendency to become low in moldability.

Further, poly-3-methyl-1-butenes are concretely homopolymers of 3-methyl-1-butene or copolymers of 3-methyl-1-butene and other α-olefin having 2 to 20 carbon atoms as aforesaid. Usually, there are used polymers consisting essentially of at least 85 mol %, preferably at least 91 mol % of 3-methyl-1-butene. Such poly-3-methyl-1-butenes as mentioned above have preferably a melt flow rate (load: 2.16 kg, temperature: 340° C.) of 5-500 g/min, more preferably 25-150 g/min for the same reasons as in the case of poly-4-methyl-1-pentene as mentioned above.

Unsaturated carboxylic acids or derivatives thereof used for graft modifying such polyolefins to be used as a base of the modified polyolefins of the present invention include unsaturated carboxylic acids such as acrylic acid, maleic acid, fumaric acid, tetrahydrophthalic acid, itaconic acid, citraconic acid, crotonic acid, isocrotonic acid, nadic acid ® (endocis-bicyclo [2,2,1] hept-5-ene-2,3-dicarboxylic acid), etc. or derivatives thereof, for example, acid halides, amides, imides, anhydrides and esters which concretely include malenyl chloride, maleimide, maleic anhydride, citraconic anhydride, monomethyl maleate, dimethyl maleate, glycidyl maleate, etc. Among these, preferred are unsaturated dicarboxylic acids or acid anhydrides thereof, particularly preferable are maleic acid, nadic acid ® or acid anhydrides thereof.

To prepare modified polyolefins by graft copolymerization of polyolefins used as a base of the modified polyolefins with a graft monomer selected from among the above-exemplified unsaturated carboxylic acids or derivatives thereof, there may be adopted various processes, per se, known. For instance, there is a process which comprises dissolving the base polyolefin and adding to the molten base polyolefin a graft monomer, thereby effecting graft copolymerization, or a process which comprises dissolving the base polyolefin in a solvent and adding to the resulting solution a graft monomer, thereby effecting graft copolymerization. In either case, it is preferable to carry out the reaction in the presence of radical initiators in order to efficiently effect the graft copolymerization of the graft monomer with the base polyolefin. The graft reaction is carried out usually at a temperature of 60°-350° C., and the proportion of the radical initiator used is usually 0.001-1 part by weight based on 100 parts by weight of the base polyolefin. Useful radical initiators include organic peroxides, organic peresters, and azo-compounds. Of these radical initiators, preferred are dialkyl peroxides such as dicumyl peroxides di-tert-butyl peroxide, 2,5-dimethyl-2,5-di(tert butylperoxy)hexine-3, 2,5-dimethyl-2,5-di(tertbutylperoxy)hexane, 1,4-bis(-tert-butylperoxyisopropyl) benzene, etc.

The modified polyolefins (B) used in the present invention may be such polyolefins as have wholly been modified with unsaturated carboxylic acids or derivatives thereof, so long as the graft amount of said unsaturated carboxylic acids or derivatives thereof used in within the aforementioned range, or the modified polyolefins (B) may be such polyolefins as have partly been modified, that is, said modified polyolefins (B) are mixtures comprising modified polyolefin and unmodified polyolefin. In the case where a mixture comprising modified polyolefin and unmodified polyolefin is used as the modified polyolefin (B), it is also possible to use said modified polyolefin in the mixture with the graft monomer at a slightly higher concentration, usually about 25% by weight, so long as the graft amount in said mixture is within the aforementioned range.

Reinforcing Fiber (C)

The reinforcing fibers (C) used in the present invention are inorganic substances such as glass fiber, carbon fiber, boron fiber, potassium titanate fiber, wollastonite, asbestos fiber, etc., or fibrous substances consisting of organic substances such as aramid fiber known as Kevlar, the trademark of DuPont de Nemours & Company for aramid polymers and fibers, and the like. Further, there may be used also such reinforcing fibers treated on the fiber surface thereof with silane type compounds, for example, vinyl triethoxysilane, γ-aminopropyl triethoxysilane, γ-aminopropyl trimethoxysilane, N-(β-aminoethyl)-γ-aminopropyl trimethoxysilane, γ-glycidoxypropyl trimethoxysilane, etc.

Oxazoline Modified Polystyrene (D)

In the fiber reinforced polyolefin compositions of the present invention, there may be used, if necessary, oxazoline-modified polystyrene (D) in addition to the components (A), (B) and (C) as mentioned previously.

The oxazoline-modified polystyrene (D) as referred to above has an oxazoline ring attached to the polystyrene along its polystyrene chain, as shown in the following formula

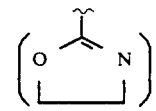

wherein ⌇⌇⌇ is a polystyrene chain.

Such oxazoline modified polystyrene may be prepared by addition reaction of polystyrene with oxazoline substituted at an unsaturated portion in the 2-position. In this connection, such oxazoline-modified polystyrene as illustrated above is commercially available as a product of The Dow Chemical Co. under a trade name of RPS.

By virtue of incorporating the above-mentioned oxazoline-modified polystyrene into the fiber reinforced heat-resistant polyolefin compositions of the present invention, said compositions are improved in mechanical strength, particularly strength at the time when high temperatures are applied thereto, and moreover a thermal deformation temperature of the compositions is improved.

Blending Proportions

The first type fiber reinforced heat-resistant polyolefin compositions of the present invention comprise, as mentioned previously, polyphenylene sulfides (A), modified polyolefins (B) and reinforcing fibers (C). In the present composition, there are present the polyphenylene sulfide (A) in an amount of 5-85% by weight, preferably 10-80% by weight, the modified polyolefin (B) in an amount of 15-95% by weight, preferably 30-80% by weight and the reinforcing fiber (C) in an amount of 10-60 parts by weight, preferably 15-50 parts by weight based on (A)+(B)=100 parts by weight.

If the amount of the polyphenylene sulfide (A) used is less than 5% by weight, there is a tendency that it becomes difficult to obtain a composition excellent in heat resistance, mechanical strength and solderability and, on the other hand, even if said amount exceeds 85% by weight, there is a tendency that the effect of improving heat resistance, mechanical strength and solderability of the resulting composition will reach the uppermost limit of the expected effect, thereby resulting in economical disadvantage from the standpoint of material costs.

If the amount of the modified polyolefin (B) used is less than 15% by weight, there is a tendency that it becomes difficult to obtain a composition excellent in impact strength and, on the other hand, even if said amount exceeds 95% by weight, the effect of improving impact strength of the resulting composition will reach the uppermost limit of the expected effect, thereby resulting in economical disadvantage from the standpoint of material costs.

If the amount of the reinforcing fiber (C) used is less than 10 parts by weight based on (A)+(B)=100 parts by weight, there is a tendency that it becomes difficult to obtain a composition excellent in heat resistance and mechanical strength and, on the other hand, if said amount exceeds 60 parts by weight, there is a tendency that the reinforcing fiber incorporated will rise to the surface of a product resulting from the composition, thereby markedly marring the appearance of the product and depreciating a value of said product as an article of commerce.

The second type fiber reinforced polyolefin compositions of the present invention further comprise oxazoline-modified polystyrene (D) in addition to the components (A), B) and (C) as defined above, and the oxazoline-modified polystyrene (D) is present in the present composition in an amount of 5-30 parts by weight, preferably 10-25 parts by weight based on (A)+(B)=100 parts by weight.

When the oxazoline-modified polystyrene (D) is incorporated into fiber reinforced polyolefin compositions in an amount as defined above, the resulting compositions are improved in mechanical strength, particularly, the strength at the time when high temperatures are applied thereto and, at the same time, a thermal deformation temperature of said compositions is also improved.

Other Components

The fiber reinforced heat-resistant polyolefin compositions of the present invention may be incorporated with various additives which can be usually used in and mixed with polyolefins, such as thermal stabilizers, weathering agents, flame-retardants, nucleating agents, pigments, dyes, lubricants, rust preventives, etc. in such ranges that the object of the present invention is not hindered thereby.

For instance, useful flame retardants include phosphoric acid esters such as tricresyl phosphate, cresyldiphenyl phosphate, diphenyloctyl phosphate, tributyl phosphate, etc.; halogen containing phosphoric acid esters such as tris($\beta$-chloroethyl)phosphate, tris (dichloropropyl)phosphate, tris(2,3-dibromopropyl) phosphate, etc.; halogen compounds such as chlorinated paraffin, chlorinated polyethylene, brominated polyphenyl, chlorinated polyphenyl, dechloranephus, tetrabromoethane, tetrabromobutane, 1,2-dibromo-3-chloropropane, 1,2,3-tribromopropane, hexabromocyclododecane, tetrabromobenzene, chlorinated diphenyl, decabromodiphenyl oxide, N,N'-ethylenebis-tetrabromophthalimide, tribromopolystylen, polydibromobenzene oxide, bistribromophenoxyethane, etc.; antimony type compounds such as antimony trioxide, antimony potassium tartarate, triphenyl stibine, etc.; boron type compounds such as borax, zinc borate, barium metaborate, etc.; and metallic hydroxides such as magnesium hydroxide, aluminum hydroxide, calcium hydroxide, barium hydroxide, etc. Of these compounds as illustrated above, preferably used are halogen compounds, particularly decrolan, decabromodiphenyl oxide, N,N'-ethylenebis-tetrabromophthalimide, brominated epoxy, etc., when used in combination with antimony trioxide, or magnesium hydroxide since this is capable of imparting flame retardant properties without bringing about lowering in heat resistance and mechanical strength.

Processes for the Preparation of the Compositions and Uses Thereof

The fiber reinforced heat-resistant compositions of the present invention may be prepared by mixing together the aforementioned components in their respective amounts as defined in accordance with the present invention. For the mixing of these components, there may be employed methods, per se, known, for example, a mixing method which comprises mixing said components together by means of a Henschel mixer, V-blender, ribbon blender, tumbler blender or the like, and a method of mixing said components in the same manner as above, melt kneading the mixture by means of a single screw extruder, twin screw extruder, kneader or the like, followed by granulation or pulverization.

The fiber reinforced heat resistant polyolefin compositions of the present invention thus prepared are markedly high in heat resistance and thermal deformation temperature and also improved in mechanical strength, as compared with conventional glass fiber reinforced polyolefins. Therefore, the present fiber reinforced heat-resistant polyolefin compositions are applicable to household electrical appliances, electronic parts and automotive parts which all require heat resisting properties, such as connectors, tuners, switches, heater ducts, radiator fans coil bobbins, IC sealants, print substrates, etc.

The present invention is illustrated below in more detail with reference to examples, but it should be construed that the invention is in no way limited to those examples.

PREPARATIVE EXAMPLE 1

Preparation of Modified Polyolefin

A graft reaction of maleic anhydride with 4-methyl-1-pentene homopolymer ([$\eta$] 1.7 dl/g, $\overline{M}w/\overline{M}n$ 7.5, melting point 241° C., crystallinity index 42%, DSC parameter 3.0) was carried out with dicumyl peroxide at 145° C. in toluene solvent. The reaction product obtained was charged with large excess of acetone to precipitate a polymer which was then collected by filtration, and the precipitate thus collected was repeatedly washed with acetone to obtain maleic anhydride graft-modified poly-4-methyl-1-pentene A [hereinafter called modified TPX(A)].

The modified polymer thus obtained had 4.0% by weight of the maleic anhydride unit as grafted, [$\eta$] 0.95 dl/g, melting point 210° C., crystallinity index 18%, $\overline{M}w/\overline{M}n$ 4.5 and DSC parameter 2.8.

PREPARATIVE EXAMPLE 2

Preparation of Modified Polyolefin

To 4-methyl-1-pentene homopolymer ([$\eta$] 3.8 dl/g, $\overline{M}w/\overline{M}n$ 7.3, melting point 240° C., crystallinity index 41% and DSC parameter 3.2 were added maleic anhydride and 2,5-dimethyl-2,5-di-tert-butyl peroxide, and the mixture was then fed in an N$_2$ atmosphere to a single screw extruder kept at 260° C. and melt kneaded to obtain maleic anhydride graft-modified poly-4-methyl-1-pentene B [hereinafter called modified TPX (B)].

The modified polymer thus obtained had 1.4% by weight of the maleic anhydride unit as grafted, [$\eta$] 0.15 dl/g, melting point 212° C., crystallinity index 14%, $\overline{M}w/\overline{M}n$ 5.2 and DSC parameter 4.3.

EXAMPLES 1 AND 2

Polyphenylene sulfide (PSS), R-4 (a trade name of polyphenylene sulfide produced and sold by Philips Co.), TPX (A) obtained in Preparative Example 1, unmodified poly-4-methyl-1-pentene (TPX ® RT18, produced and sold by Mitsui Petrochemical Industries. Ltd.) and glass fiber (GF) were mixed together in the proportions as indicated in Table 1. The mixture was then melt kneaded at a molding temperature of 290° C. by means of a twin screw extruder and injection molded at that temperature by means of an injection molding machine (IS 50 manufactured and sold by Toshiba Machine Co., Ltd.) to prepare a test specimen.

The test specimens thus obtained were subjected to tests in the following manner. The results obtained are shown in Table 1.

Tensile strength (TS: kg/cm$^2$): The measurement was conducted in accordance with ASTM D 638.

Izod impact strength (IZ: kg cm/cm): The measurement was conducted in accordance with ASTM D 256.

Heat deformation temperature (HDT: °C.): The measurement was conducted in accordance with ASTM D 678 (load: 18.6 kg/cm$^2$).

COMPARATIVE EXAMPLE 2

The same procedure as in Example 1 was carried out except that the TPX (A) was excluded and the amount of TPX used increased to 35% by weight. The results obtained are shown in Table 1.

COMPARATIVE EXAMPLE 3

The same procedure as in Example 1 was carried out except that the TPX and TPX (A) were not used, and the amount of the PRS used was increased to 70% by weight.

The results obtained are shown in Table 1.

TABLE 1

| | | EX. 1 | EX. 2 | EX. 3 | EX. 4 | Compar. EX. 1 | Compar. EX. 2 | Compar. EX. 3 |
|---|---|---|---|---|---|---|---|---|
| Composition (wt %) | PPS | 35 | 35 | 35 | 31 | | 35 | 70 |
| | TPX (A) | 1 | 5 | | 1 | 1 | | |
| | TPX (B) | | | 35 | | | | |
| | TPX | 34 | 30 | | 30 | 69 | 35 | |
| | GF | 30 | 30 | 30 | 30 | 30 | 30 | 30 |
| | RPS | | | | 8 | | | |
| TS (Tensile Strength) | | 850 | 900 | 950 | 1050 | 550 | 550 | 1200 |
| IZ (Izod impact strength) | | 9 | 10 | 10 | 10 | 12 | 6 | 6 |
| HDT (Heat Deformation Temperature) | | 190 | 200 | 190 | 205 | 180 | 120 | 235≦ |
| Solderability | | ○ | ○ | ○ | ○ | Δ | ○ | ○ |

Solderability: The measurement was conducted in accordance with JIS C 5034, wherein a plate of the specimen of 2 mm in thickness was immersed for 10 seconds in molten solder kept at 260° C. to visually check whether the plate was deformed or not. The result was represented by ○ when no deformation was observed and by Δ when deformation was slightly observed.

EXAMPLE 3

The same procedure as described in Example 1 was carried out except that TPX (B) obtained in preparative Example 2 was used in place of the TPX and TPX (A) used in Example 1. The results obtained are shown in Table 1.

EXAMPLE 4

PPS, TPX, TPX (A), GF and oxazoline-modified polystyrene (RPS produced and sold by the Dow Chemical Co.) were mixed together in the same manner as in Example 1, and the molded article obtained was evaluated in the same manner as in Example 1. The results obtained are shown in Table 1.

COMPARATIVE EXAMPLE 1

The same procedure as in Example 1 was carried out except that the PPS was excluded and the amount of TPX used was increased to 69% by weight. The results obtained are shown in Table 1.

It is understood from Table 1 that the composition comprising modified polyolefin (B) and reinforcing fiber (C) only is poor in tensile strength (TS), low in heat deformation temperature (HDT) and, moreover, poor in solderability, that the composition comprising only polyphenylene sulfide (A), unmodified polyolefin and reinforcing fiber (C) is poor in tensile strength (TS), and further that the composition comprising polyphenylene sulfide (a) and reinforcing fiber (C) is poor in Izod compact strength (IZ).

What is claimed is:

1. A fiber reinforced heat-resistant polyolefin composition comprising:
   5-85% by weight of polyphenylene sulfide (A),
   15-95% by weight of graft-modified polyolefin (B) having grafted units of an unsaturated carboxylic acid or a derivative thereof selected from the group consisting of halides, amides, imides, anhydrides and esters in an amount of 0.01 to 10% by weight, the graft-modified polyolefin having a melting point of about 200° C., and
   10-60 parts by weight based on 100 parts by weight of (A)+(B), of reinforcing fiber (C).

2. The fiber reinforced heat-resistant polyolefin composition as claimed in claim 1 wherein the polyolefin onto which the carboxylic acid or derivative is grafted (B) is poly-4-methyl-1-pentene or poly-3-methyl-1-butene.

* * * * *